United States Patent [19]

Higuchi et al.

[11] Patent Number: 5,994,785
[45] Date of Patent: Nov. 30, 1999

[54] EPOXY RESIN COMPOSITIONS AND SEMICONDUCTOR DEVICES ENCAPSULATED THEREWITH

[75] Inventors: Noriaki Higuchi, Chiyoda-ku, Japan; Koji Futatsumori, Shah Alam, Malaysia; Chiat Hooi Keow, Shah Alam, Malaysia; Hui Teng Teoh, Shah Alam, Malaysia; Toshio Shiobara, Usui-gun, Japan

[73] Assignees: Mitsubishi Denki Kabushiki Kaisha; Shin-Etsu Chemical Co., Ltd., both of Tokyo, Japan

[21] Appl. No.: 09/305,453

[22] Filed: May 6, 1999

[30] Foreign Application Priority Data

May 7, 1998 [JP] Japan .................................. 10-140538

[51] Int. Cl.$^6$ ............................ H01L 23/29; C08L 63/00; C08F 28/00
[52] U.S. Cl. .......................... 257/789; 257/793; 257/788; 523/427; 525/481; 525/423
[58] Field of Search .................................... 257/793, 794, 257/795, 789, 787

[56] References Cited

U.S. PATENT DOCUMENTS

| | | | |
|---|---|---|---|
| 4,719,269 | 1/1988 | Ando et al. ............................... | 525/524 |
| 4,859,722 | 8/1989 | Shiobara et al. ......................... | 523/433 |
| 5,053,445 | 10/1991 | Itoh et al. ................................. | 523/435 |
| 5,126,188 | 6/1992 | Shimizu et al. .......................... | 428/215 |
| 5,322,864 | 6/1994 | Sugimoto et al. ....................... | 523/457 |
| 5,416,138 | 5/1995 | Mogi et al. .............................. | 523/466 |
| 5,739,187 | 4/1998 | Asano et al. ............................. | 523/451 |
| 5,827,908 | 10/1998 | Arai et al. ................................ | 523/212 |
| 5,840,824 | 11/1998 | Akatsuka et al. ........................ | 528/97 |

*Primary Examiner*—Mahshid Saadat
*Assistant Examiner*—Jhihan B Clark
*Attorney, Agent, or Firm*—Millen, White, Zelano & Branigan, P.C.

[57] ABSTRACT

In an epoxy resin composition comprising an epoxy resin, a curing agent, and at least 70% by weight of an inorganic filler, at least one of the epoxy resin and the curing agent has such a molecular weight distribution as to provide an average dispersity Mw/Mn of less than 1.6, a two-nucleus compound content of less than 8% by weight and a seven- and more-nucleus compound content of less than 32% by weight. When the composition is cured at 180° C. for 90 seconds into a primary product having Tg1 and the primary product postcured at 180° C. for 5 hours into a secondary product having Tg2, the relationship: (Tg2−Tg1)/Tg2<0.1 is satisfied. The composition is fast-curing and effectively moldable and cures into a reliable product without a need for postcure.

4 Claims, No Drawings

EPOXY RESIN COMPOSITIONS AND SEMICONDUCTOR DEVICES ENCAPSULATED THEREWITH

BACKGROUND OF THE INVENTION

1. Field of the Invention

The present invention relates to epoxy resin compositions which are fast-curing and effectively moldable and cure into reliable products without a need for postcure. The invention also relates to semiconductor devices encapsulated with the compositions in a cured state.

2. Prior Art

The semiconductor devices in use today are predominantly resin encapsulated diodes, transistors, integrated circuit (IC) chips, large scale integration (LSI) chips, and very large scale integration (VLSI) chips. Resin encapsulation is usually carried out with epoxy resin compositions because epoxy resins offer superior properties (e.g., moldability, adhesion, electrical characteristics, mechanical characteristics, and moisture resistance), compared with other thermosetting resins.

For cost reduction and energy saving purposes, there is an increasing demand for epoxy resin compositions having adequate molding properties including fast-curing and curing into reliable products which can be used without postcure.

However, if the amount of catalyst is increased for endowing fast-curing properties, the resulting epoxy resin compositions have many disadvantages including a shortened gel time and an increased melt viscosity, which cause underfilling, voids and gold wire shifts. In addition, these compositions have poor shelf stability and provide less reliable encapsulation of semiconductor devices.

SUMMARY OF THE INVENTION

Therefore, an object of the invention is to provide an epoxy resin composition which is effectively moldable and eliminates a need for postcure. Another object is to provide a reliable semiconductor device encapsulated with the composition in a cured state.

Regarding an epoxy resin composition comprising an epoxy resin, a curing agent, and an inorganic filler, with high loadings of the inorganic filler, the inventor has found that when either one or both of the epoxy resin and the curing agent has a specific molecular weight distribution and the change of glass transition temperature between as-molded and as-postcured products is minimized, the resulting epoxy resin composition has good moldability and shelf stability and can be used without postcuring.

The present invention provides an epoxy resin composition comprising an epoxy resin, a curing agent, and an inorganic filler as essential components. (A) At least one of the epoxy resin and the curing agent has such a molecular weight distribution that the average dispersity $Mw/Mn$ defined as a weight average molecular weight $Mw$ divided by a number average molecular weight $Mn$ is less than 1.6, and the content of a two-nucleus compound is less than 8% by weight and the total content of seven- and more-nucleus compounds is less than 32% by weight. (B) The inorganic filler is present in an amount of at least 70% by weight of the entire composition. (C) When the composition is cured at 180° C. for 90 seconds into a primary product having a first glass transition temperature $Tg1$ and the primary product is postcured at 180° C. for 5 hours into a secondary product having a second glass transition temperature $Tg2$, the first and second glass transition temperatures $Tg1$ and $Tg2$ satisfy the relationship:

$$(Tg2-Tg1)/Tg2<0.1.$$

For simplicity's sake, the glass transition temperature is often abbreviated as Tg.

DETAILED DESCRIPTION OF THE INVENTION

The epoxy resin used herein may be any epoxy resin having at least two epoxy groups per molecule. Illustrative examples of suitable epoxy resins include bisphenol-type epoxy resins such as bisphenol A epoxy resins and bisphenol F epoxy resins, novolac-type epoxy resins such as phenolic novolac epoxy resins and cresol novolac epoxy resins, triphenolalkane epoxy resins and polymerized products thereof, biphenyl epoxy resins, dicyclopentadiene-modified phenol novolac epoxy resins, phenolic aralkyl epoxy resins, biphenyl aralkyl epoxy resins, naphthalene ring-containing epoxy resins, glycidyl ester type epoxy resins, alicyclic epoxy resins, heterocyclic epoxy resins, and brominated epoxy resins. Of these epoxy resins, novolac-type epoxy resins such as epoxy cresol novolac resins are preferable from the considerations of cost and moldability.

The epoxy resins should preferably have a softening point of 50 to 120° C. and an epoxy equivalent of 100 to 400. Epoxy resins with a softening point of lower than 50° C. tend to form burrs and voids when molded and would result in cured products having a lower Tg whereas epoxy resins with a softening point of high than 120° C. would be too viscous to mold.

When the epoxy resins are used for the encapsulation of semiconductor devices, it is preferred that the content of hydrolyzable chlorine be up to 1,000 ppm, more preferably up to 500 ppm, and the contents of sodium and potassium be each up to 10 ppm. If semiconductor devices are encapsulated with compositions containing an epoxy resin with more than 1,000 ppm of hydrolyzable chlorine or more than 10 ppm of sodium or potassium, the encapsulated devices would experience deterioration of moisture resistance during long-term storage under hot humid conditions.

The curing agent for the epoxy resins is preferably a phenolic resin having at least two phenolic hydroxyl groups per molecule. Exemplary curing agents include bisphenol-type phenolic resins such as bisphenol A and bisphenol F, novolac-type phenolic resins such as phenolic novolac resins and cresol novolac resins; phenolic resins such as resole type phenolic resins, phenol aralkyl resins, biphenyl type phenolic resins, biphenyl aralkyl-type phenolic resins, and triphenol alkane resins and polymerized products thereof; and naphthalene ring-bearing phenolic resins and dicyclopentadiene-modified phenolic resins. Of these phenolic resins, novolac-type phenolic resins such as phenolic novolac resins are preferable from the considerations of cost and moldability. Amine curing agents and acid anhydride curing agents may also be used in combination with the phenolic resins.

The phenolic resin curing agents should preferably have a softening point of 60 to 150° C., especially 70 to 130° C. and a phenolic hydroxyl equivalent of 90 to 250. When the phenolic resins are used for the encapsulation of semiconductor devices, it is preferred that the contents of sodium and potassium be each up to 10 ppm. If semiconductor devices are encapsulated with compositions containing a phenolic resin with more than 10 ppm of sodium or potassium, the encapsulated devices would experience accelerated deterioration of moisture resistance during long-term storage under hot humid conditions.

The curing agent may be blended in any desired amount insofar as the amount is effective for causing the epoxy resin to cure. When the phenolic resin as mentioned above is used as the curing agent, it is preferably blended in such amounts that the molar ratio of phenolic hydroxyl groups in the phenolic resin to epoxy groups in the epoxy resin may range from 0.5 to 1.5, especially from 0.8 to 1.2.

According to the present invention, in order to improve moldability and eliminate postcuring, either one, preferably both of the epoxy resin and the curing agent should have such a molecular weight distribution that (1) the average dispersity Mw/Mn defined as a weight average molecular weight Mw divided by a number average molecular weight Mn is less than 1.6, and (2) the content of a two-nucleus compound is less than 8% by weight and the total content of seven- and more-nucleus compounds is less than 32% by weight.

With the average dispersity Mw/Mn less than 1.6, if the content of a two-nucleus compound is equal to or more than 8% by weight, the Tg as molded becomes low, and if the content of seven- and more-nucleus compounds is equal to or more than 32% by weight, the melt viscosity becomes high, inducing failures such as wire shifts. If the average dispersity Mw/Mn is equal to or more than 1.6, even though condition (2) is satisfied, curing reaction becomes non-uniform and reactivity lowers, resulting in lowerings of Tg and moisture resistance. The more preferred molecular weight distribution is that the average dispersity Mw/Mn is 1.0≦Mw/Mn≦1.5, the content of a two-nucleus compound is up to 7% by weight, and the total content of seven- and more-nucleus compounds is up to 30% by weight.

The term "nucleus" in the epoxy resin or curing agent (i.e., phenolic resin) designates a benzene ring skeleton contained in the molecule of the epoxy resin or phenolic resin as the curing agent. For example, a biphenyl skeleton and naphthalene skeleton each are counted as "two-nucleus."

The inorganic filler is selected from fillers commonly used in epoxy resin compositions and blended in an amount of at least 70% by weight of the entire composition. The inorganic filler is blended in order to reduce the coefficient of expansion of encapsulants for reducing the stress applied to semiconductor devices. Typical of the inorganic filler are fused silica in ground or spherical form and crystalline silica, although alumina, silicon nitride, aluminum nitride, and other fillers may also be used.

The inorganic filler preferably has a mean particle size of 3 to 30 μm, especially 5 to 20 μm. The loading of inorganic filler is at least 70% by weight of the entire composition, and typically 70 to 92% by weight, especially 75 to 90% by weight of the entire composition. Epoxy resin compositions loaded with less than 70% by weight of the inorganic filler have a high coefficient of expansion, causing greater stresses to be applied to semiconductor devices and hence, deterioration of the device characteristics. In addition, epoxy resin compositions loaded with less than 70% by weight of the inorganic filler have a lower Tg immediately after molding than the fully loaded compositions.

The mean particle size can be determined as a weight mean diameter or median diameter by a particle size distribution measuring device based on such a process as laser light diffraction process.

To achieve a good compromise between reduced expansion of cured products and moldability of compositions, it is recommended to use a blend of fillers in spherical and ground forms or only a filler in spherical form. The inorganic filler is preferably used after it is surface treated with a coupling agent such as silane coupling agents and titanium compound coupling agents.

In the composition, conventional well-known curing accelerators such as organic phosphorus derivatives and organic nitrogenous derivatives may be used. It is especially preferred to use latent catalysts as the curing accelerator. If non-latent curing accelerators are used in a sufficient amount to endow fast-curing ability, then the compositions can be degraded in moldability and shelf stability. The latent catalyst may be selected from conventional well-known ones, for example, tertiary amine compounds and organic phosphorus compounds.

Examples of the tertiary amine compounds include amine compounds having an alkyl or aralkyl group as a substituent bonded to a nitrogen atom such as triethylamine, benzyldimethylamine and α-methylbenzyldimethylamine, cycloamidine compounds and organic acid salts thereof such as 1,8-diazabicyclo[5.4.0]undecene-7 and its phenol salt, octanoic acid salt and oleic acid salt, and salts or complex salts of cycloamidine compounds and quaternary boron compounds such as the compound below:

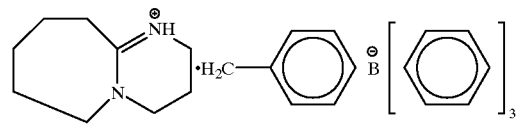

Examples of the organic phosphorus compounds include organic phosphine compounds and salts thereof such as triphenylphosphine, tributylphosphine, tri(p-toluil)-phosphine, tri(p-methoxyphenyl)phosphine, tri(p-ethoxyphenyl)phosphine, triphenylphosphine.triphenylborate, and quaternary phosphonium compounds and salts thereof such as tetraphenylphosphonium.tetraphenylborate. Preferred are triphenylphosphine and its derivatives, and phenol salts, quaternary phosphonium salts and derivatives of tertiary amines.

The amount of curing accelerator used is usually up to 10 parts, preferably 0.001 to 10 parts, especially 0.1 to 4 parts by weight per 100 parts by weight of the epoxy resin. Less than 0.001 part of the curing accelerator sometimes would be too small to provide a fast-curing ability whereas more than 10 parts would give a too high curing rate to mold acceptable parts.

For imparting flexibility, toughness or bondability to the epoxy resin composition in the cured state, silicone-modified aromatic resin copolymers such as block copolymers of organopolysiloxanes and epoxy resins and block copolymers of organopolysiloxanes and phenolic resins, various organic synthetic rubbers, thermoplastic resins such as methyl methacrylate-styrene-butadiene copolymers and styrene-ethylene-butene-styrene copolymers, silicone gel, and silicone rubber may be added in finely divided form. Also, the inorganic filler may be surface treated with two-part type silicone rubber compounds or silicone gel. It is noted that the silicone-modified aromatic resin copolymers and methyl methacrylate-styrene-butadiene copolymers mentioned above are also effective for reducing the stress of epoxy resins.

The amount of the silicone-modified aromatic resin copolymer and/or thermoplastic resin used as the stress-reducing agent is usually up to 10% by weight, preferably 0.2 to 10% by weight, especially 0.5 to 5% by weight of the entire epoxy resin composition. Less than 0.2% of such component sometimes would fail to provide sufficient resistance to heat shock whereas more than 10% would cause a loss of mechanical strength.

In the composition of the invention, if desired for improving moisture resistance and hot-storage stability, there may be further blended parting agents such as modified carnauba wax, higher fatty acids, and synthetic waxes as well as silane coupling agents, titanium coupling agents, antimony oxide and phosphorus compounds.

The epoxy resin composition of the present invention may be prepared by melt mixing the ingredients described above in a suitable apparatus such as a hot roll mill, kneader or continuous extruder. The order of blending the ingredients is not critical.

In order that the epoxy resin composition be usable without a need for postcuring, the composition should satisfy the minimal change of glass transition temperature between its molded and postcured products. Specifically, when the composition is molded (and cured) into a primary product having a first glass transition temperature Tg1 and the primary product is then postcured into a secondary product having a second glass transition temperature Tg2, the change of Tg, defined as (Tg2−Tg1)/Tg2, is less than 0.1.

$$(Tg2-Tg1)/Tg2<0.1$$

The Tg1 of the primary or as-molded product is the glass transition temperature as measured by TMA (i.e., Thermal Mechanical Analysis) of a specimen (5×5×15 mm) molded and cured at 180° C. for 90 seconds using a transfer molding machine. The Tg2 of the secondary or as-postcured product is the glass transition temperature of the same specimen postcured at 180° C. for 5 hours.

A Tg change of equal to or more than 0.1 indicates a greater difference in glass transition temperature between molded and postcured states, failing to provide an epoxy resin composition which can be used without postcuring. Since semiconductor devices encapsulated with epoxy resin compositions are often exposed to a high-temperature environment because of the heat generation during operation, a composition with a Tg change of equal to or more than 0.1 allows its Tg to gradually change in the service environment, resulting in variations of various properties and still worse, warpage of the device.

Preferably, the Tg change is from 0 to 0.08.

In order to ensure that the epoxy resin composition perform without postcuring, the epoxy resin composition should preferably have a (residual) conversion as defined by the following expression.

$$\Delta H1/\Delta H0<0.05.$$

ΔH is an enthalpy change, that is reaction energy, obtained when the epoxy resin composition or its primary cured product is analyzed by differential scanning colorimetry (DSC). ΔH0 is an enthalpy change obtained when the uncured composition is analyzed by DSC, and ΔH1 is an enthalpy change obtained when the primary product obtained by curing the composition at 180° C. for 90 seconds is analyzed by DSC.

Provided that the enthalpy change ΔH0 until the uncured composition is completely cured, as measured by DSC, corresponds to a conversion of 100%, the above expression indicates that the primary product obtained by curing the composition at 180° C. for 90 seconds has a residual conversion of less than 5%. ΔH1/ΔH0 values equal to or more than 0.05 indicate that the curing reaction of the primary product has not proceeded to a full extent, so that if the primary product as molded is used without postcuring, it undesirably undergoes thermal degradation and hence, changes its properties. The preferred value of ΔH1/ΔH0, that is residual conversion, is up to 4.5%, especially 0 to 4.2%.

The Tg change can be controlled so as to fall within the above-specified range, by selecting the molecular weight distribution of the epoxy resin and/or the curing agent within the above-specified range and selecting the blending amount of the inorganic filler at or above 70% by weight of the entire composition. The residual conversion can be controlled so as to fall within the above-specified range, by restricting the content of two-nucleus compound below 8% by weight in addition to the above selections.

The epoxy resin compositions of the invention can be effectively used for encapsulating various types of semiconductor packages including DIP, flat pack, PLCC and SO types. Encapsulation can be carried out by conventional molding methods, for example, transfer molding, injection molding and casting. The epoxy resin composition of the invention is preferably molded at a temperature of about 150 to 190° C. Postcuring is essentially unnecessary although no detrimental problems arise when postcuring is effected at about 150 to 185° C. for about ½ to 16 hours.

There have been described epoxy resin compositions which are fast-curing and effectively moldable and cure into reliable products without a need for postcure. The semiconductor devices encapsulated with these compositions in a cured state are thus highly reliable.

EXAMPLE

The following examples are provided to illustrate the invention, and are not intended to limit the scope thereof. All parts are by weight.

Examples 1–4 and Comparative Examples 1–3

Seven epoxy resin compositions were prepared by using the epoxy resin shown in Table 1 and the phenolic resin shown in Table 2 in the combination shown in Table 3 and adding thereto 400 parts of a silica mixture consisting of 20% by weight of fragmental fused silica with a mean particle size of 10 μm, 75% by weight of spherical fused silica with a mean particle size of 30 μm, and 5% by weight of spherical fused silica with a mean particle size of 0.5 μm, 10 parts of antimony trioxide, 1.5 parts of Wax E, 1.0 part of carbon black, 10 parts of a brominated epoxy phenolic novolac resin having a bromide content of 35.5% by weight and an epoxy equivalent of 283, and 1.0 part of 3-glycidyloxypropyl trimethoxysilane. The blends were uniformly melt milled in a hot two-roll mill, and further melt milled with triphenylphosphine as a curing accelerator, the amount of which is shown in Table 3. It is noted that the amount of the epoxy resin, phenolic resin, and brominated epoxy phenolic novolac resin combined was 100 parts, and the molar ratio of phenolic hydroxyl groups in the phenolic resin to epoxy groups in all the epoxy resins was 1.0.

The thus obtained epoxy resin compositions were examined for the following properties. The results are shown in Table 3.

(1) Spiral Flow

The spiral flow was measured according to EMMI standards by molding the composition in a mold at 180° C. and 70 kgf/cm².

(2) Hardness When Hot

A rod measuring 100×10×4 mm was molded at 180° C. and 70 kgf/cm² for 90 seconds. The hardness when hot was measured with a Barcol Impressor.

(3) Glass Transition Temperature (Tg)

A test specimen with dimensions of 5×5×15 mm was molded at 180° C. and 70 kgf/cm² for 90 seconds. Measurement was carried out by heating the test specimen at a rate of 5° C./min in a dilatometer, obtaining Tg1. The specimen was postcured at 180° C. for 5 hours before measurement was similarly carried out by means of the dilatometer, obtaining Tg2.

(4) Residual Conversion

The composition was analyzed by DSC to determine ΔH0 and ΔH1, from which the residual conversion ΔH1/ΔH0 was calculated.

Note that ΔH is an enthalpy change obtained when the epoxy resin composition or its primary cured product is analyzed by DSC. ΔH0 is an enthalpy change obtained when the uncured composition is analyzed by DSC, and ΔH1 is an enthalpy change obtained when the cured product obtained by molding the composition at 180° C. for 90 seconds is analyzed by DSC.

(5) Package Voids

Six quad flat packs (QFP) of 14×20×2 mm were molded under conditions: 180° C., 70 kgf/cm² and a time of 90 seconds. Using an ultrasonic flaw detector, internal voids were examined. Voids with a size larger than 0.5 mm were counted.

(6) Moisture Resistance

Forty 100-pin quad flat packs (QFP) including an IC circuit were molded under conditions: 180° C., 70 kgf/cm² and a time of 90 seconds. A pressure cooker test (PCT) was carried out at 121° C. for 1,500 hours. Those samples whose resistance increased by a factor of 3 or more were counted.

(7) Wire Flow

Ten 100-pin QFP's were molded under the same conditions as in (6). Percent gold wire shifts were determined. An average of maximum percent wire shifts was determined for each package.

TABLE 1

| | Epoxy equivalent | Softening point (° C.) | Mw/Mn | Two-nucleus content (%) | Seven and more-nucleus content (%) |
|---|---|---|---|---|---|
| Epoxy resin A | 192 | 72 | 1.41 | 6 | 29 |
| Epoxy resin B | 166 | 56 | 1.33 | 1> | 2 |
| Epoxy resin C | 198 | 69 | 2.07 | 12 | 39 |

Epoxy resin A is an epoxidized o-cresol novolac resin
Epoxy resin B is an epoxidized triphenolmethane resin.
Epoxy resin C is an epoxidized o-cresol novolac resin (comparative one).

TABLE 2

| | Hydroxyl equivalent | Softening point (° C.) | Mw/Mn | Two-nucleus content (%) | Seven and more-nucleus content (%) |
|---|---|---|---|---|---|
| Phenolic resin D | 109 | 98 | 1.24 | 5 | 28 |
| Phenolic resin E | 109 | 100 | 1.75 | 15 | 44 |
| Phenolic resin F | 109 | 80 | 1.68 | 28 | 38 |

Phenolic resin D is a phenolic novolac resin.
Phenolic resin E is a phenolic novolac resin (comparative one).
Phenolic resin F is a phenolic novolac resin (comparative one).

TABLE 3

| | E1 | E2 | E3 | E4 | CE1 | CE2 | CE3 |
|---|---|---|---|---|---|---|---|
| Epoxy resin A | 54.75 | 54.75 | 0 | 0 | 0 | 0 | 0 |
| Epoxy resin B | 0 | 0 | 0 | 52.00 | 0 | 0 | 0 |
| Epoxy resin C | 0 | 0 | 55.56 | 0 | 55.56 | 55.56 | 55.56 |
| Phenolic resin D | 35.25 | 0 | 34.44 | 0 | 0 | 0 | 0 |
| Phenolic resin E | 0 | 35.25 | 0 | 38.00 | 34.44 | 34.44 | 0 |
| Phenolic resin F | 0 | 0 | 0 | 0 | 0 | 0 | 34.44 |

TABLE 3-continued

|  | E1 | E2 | E3 | E4 | CE1 | CE2 | CE3 |
|---|---|---|---|---|---|---|---|
| Curing accelerator | 0.8 | 0.8 | 0.8 | 0.8 | 0.8 | 1.0 | 0.8 |
| Spiral flow (cm) | 93 | 87 | 85 | 91 | 70 | 61 | 85 |
| Hardness when hot | 83 | 82 | 78 | 84 | 71 | 80 | 68 |
| Tg1 (° C.) | 158 | 154 | 150 | 160 | 135 | 147 | 126 |
| Tg2 (° C.) | 166 | 164 | 162 | 170 | 160 | 164 | 158 |
| (Tg2-Tg1)/Tg2 | 0.05 | 0.06 | 0.07 | 0.06 | 0.16 | 0.09 | 0.20 |
| Residual conversion (%) | 3.8 | 4.2 | 4.3 | 3.4 | 6.2 | 4.1 | 7.8 |
| Package voids | 0 | 0 | 0 | 0 | 4 | 6 | 2 |
| Moisture resistance | 0/40 | 0/40 | 0/40 | 0/40 | 2/40 | 13/40 | 0/40 |
| Wire shift (%) | 3 | 4 | 4 | 3 | 10< | 10<*[1] | 6 |
| Overall rating | OK | OK | OK | OK | NG | NG | NG |

*[1]wire breaking failures during molding

The data of Table 3 show that, as compared with prior art epoxy resin compositions (Comparative Examples), the epoxy resin compositions within the scope of the invention are improved in curing and molding performance and provide reliable molded parts even when used without postcuring.

The composition of Comparative Example 1 shows low Tg as molded due to high residual conversion as molded and increased wire shifts due to poor flow. The composition of Comparative Example 2 is improved in curing performance owing to the increased amount of curing accelerator, but at the expense of wire shifts and wire breakage. The composition of Comparative Example 3 uses a low viscosity resin for improving flow, which hinders the curing of the composition.

Examples 5–7 and Comparative Example 4

Epoxy resin compositions were prepared as in Example 1 except that the amount of the silica mixture blended was changed as shown in Table 4. These compositions were similarly tested, with the results shown in Table 4.

TABLE 4

|  | E5 | E6 | E1 | E7 | CE4 |
|---|---|---|---|---|---|
| Silica mixture (pbw) | 600 | 500 | 400 | 300 | 200 |
| Inorganic filler (wt %) | 85.7 | 83.2 | 79.9 | 75.1 | 67.1 |
| Spiral flow (cm) | 54 | 75 | 93 | 141 | 232 |
| Hardness when hot | 88 | 86 | 83 | 78 | 71 |
| Tg1 (° C.) | 163 | 160 | 158 | 155 | 149 |
| Tg2 (° C.) | 171 | 168 | 166 | 164 | 162 |
| (Tg2-Tg1)/Tg2 | 0.05 | 0.05 | 0.05 | 0.05 | 0.08 |
| Residual conversion (%) | 3.4 | 3.8 | 3.8 | 3.9 | 4.7 |

As is evident from Table 4, compositions with high loadings of the inorganic filler have high Tg as molded and are thus best suited for use without postcuring.

Japanese Patent Application No. 140538/1998 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

We claim:

1. An epoxy resin composition comprising an epoxy resin, a curing agent, and an inorganic filler as essential components, wherein (A) at least one of the epoxy resin and the curing agent has such a molecular weight distribution that the average dispersity Mw/Mn defined as a weight average molecular weight Mw divided by a number average molecular weight Mn is less than 1.6, and the content of a two-nucleus compound is less than 8% by weight and the total content of seven- and more-nucleus compounds is less than 32% by weight, (B) the inorganic filler is present in an amount of at least 70% by weight of the entire composition, and (C) when the composition is cured at 180° C. for 90 seconds into a primary product having a first glass transition temperature Tg1 and the primary product post-cured at 180° C. for 5 hours into a secondary product having a second glass transition temperature Tg2, the first and second glass transition temperatures Tg1 and Tg2 satisfy the relationship:

$(Tg2-Tg1)/Tg2 < 0.1.$

2. The epoxy resin composition of claim 1 wherein the epoxy resin is an epoxy cresol novolac resin and the curing agent is a phenolic novolac resin.

3. The epoxy resin composition of claim 1 wherein an enthalpy change $\Delta H0$ obtained when the composition is analyzed by differential scanning colorimetry and an enthalpy change $\Delta H1$ obtained when the primary product obtained by curing the composition at 180° C. for 90 seconds is analyzed by differential scanning colorimetry satisfy the following relationship:

$\Delta H1/\Delta H0 < 0.05.$

4. A semiconductor device encapsulated with the epoxy resin composition of claim 1 in a cured state.

* * * * *